(12) United States Patent
Huang et al.

(10) Patent No.: US 12,727,116 B2
(45) Date of Patent: Sep. 1, 2026

(54) ZONED HEAT DISSIPATION CONTROL SYSTEM FOR WATER COOLING RADIATOR AND WATER COOLING HEAT DISSIPATION SYSTEM HAVING THE ZONED HEAT DISSIPATION CONTROL SYSTEM

(71) Applicant: GIGA-BYTE TECHNOLOGY CO., LTD., New Taipei City (TW)

(72) Inventors: Shun-Chih Huang, New Taipei City (TW); Tai-Chuan Mao, New Taipei City (TW); Po-Sheng Chiu, New Taipei City (TW); Wei-En Shih, New Taipei City (TW); Chih-Chia Lin, New Taipei City (TW)

(73) Assignee: GIGA-BYTE TECHNOLOGY CO., LTD., New Taipei City (TW)

( * ) Notice: Subject to any disclaimer, the term of this patent is extended or adjusted under 35 U.S.C. 154(b) by 364 days.

(21) Appl. No.: 18/498,348

(22) Filed: Oct. 31, 2023

(65) Prior Publication Data

US 2024/0147661 A1 May 2, 2024

(30) Foreign Application Priority Data

Oct. 31, 2022 (TW) ................................. 111141363

(51) Int. Cl.
*H05K 7/20* (2006.01)

(52) U.S. Cl.
CPC ..... *H05K 7/20272* (2013.01); *H05K 7/20209* (2013.01); *H05K 7/20263* (2013.01)

(58) Field of Classification Search
CPC ........... H05K 7/20272; H05K 7/20209; H05K 7/20263; H01L 23/34; H01L 23/46; H01L 23/467; H01L 23/473; G06F 2200/201; G06F 1/206; G06F 1/20
See application file for complete search history.

(56) References Cited

U.S. PATENT DOCUMENTS

2009/0116189 A1 5/2009 Chang et al.
2012/0012283 A1 1/2012 Bean, Jr. et al.
2012/0065808 A1 3/2012 Lin et al.
(Continued)

FOREIGN PATENT DOCUMENTS

CN 205581763 U 9/2016
CN 208026126 U 10/2018
(Continued)

*Primary Examiner* — Charles R Kasenge
(74) *Attorney, Agent, or Firm* — MUNCY, GEISSLER, OLDS & LOWE, P.C.

(57) ABSTRACT

A zoned heat dissipation control system for a water cooling radiator and a water cooling heat dissipation system having the zoned heat dissipation control system includes a plurality of fans, a plurality of heat dissipation zones defined on the water cooling radiator, a thermal detector, and a control unit. At least one of the fans is disposed within each of the heat dissipation zones. The thermal detector is disposed within at least one of the heat dissipation zones and configured to detect the temperature of the water cooling radiator. The control unit is electrically connected to the fans and the thermal detector and configured to modulate the rotational speed of the fan within each of the heat dissipation zones based on the detected data from the thermal detector.

4 Claims, 6 Drawing Sheets

(56) References Cited

U.S. PATENT DOCUMENTS

| | | | | |
|---|---|---|---|---|
| 2018/0267582 | A1* | 9/2018 | Woo | G05D 13/62 |
| 2018/0275696 | A1* | 9/2018 | North | G05D 23/1919 |
| 2022/0071053 | A1 | 3/2022 | Korta et al. | |

FOREIGN PATENT DOCUMENTS

| | | | |
|---|---|---|---|
| JP | 9-298377 | A | 11/1997 |
| JP | H09298377 | A | 11/1997 |
| JP | 2006-303486 | A | 11/2006 |
| JP | 2009-134532 | A | 6/2009 |
| JP | 20113153 | A | 1/2011 |
| JP | 2011003153 | A | 1/2011 |
| TW | 201344058 | A | 11/2013 |
| TW | 610201 | M | 4/2021 |
| WO | 2012140714 | A1 | 10/2012 |
| WO | 2014041819 | A1 | 3/2014 |
| WO | 2022034673 | A1 | 2/2022 |

* cited by examiner

ZONED HEAT DISSIPATION CONTROL SYSTEM FOR WATER COOLING RADIATOR AND WATER COOLING HEAT DISSIPATION SYSTEM HAVING THE ZONED HEAT DISSIPATION CONTROL SYSTEM

CROSS-REFERENCE TO RELATED APPLICATION

This application claims the benefit of the filing date of Taiwan Patent Application No. 111141363, filed on Oct. 31, 2022, in the Taiwan Intellectual Property Office, the disclosure of which is incorporated herein in its entirety by reference.

BACKGROUND OF THE INVENTION

Field of the Invention

The present invention relates to a water cooling heat dissipation system, in particular to a zoned heat dissipation system for water cooling radiator and a water cooling heat dissipation system having the zoned heat dissipation system.

Description of the Related Art

In electronic devices, heat generation is an inherent outcome of operation, potentially leading to an elevated temperature. This temperature increase may adversely affect a device's performance under specific conditions. To mitigate this, it is essential to deploy heat dissipation devices to eliminate excess heat and stabilize the operational temperature. Various heat dissipation devices are at hand, from air cooling devices relying on air for heat dispersion, to water cooling devices leveraging cooling liquids. Due to enhanced thermal conductivity of cooling liquids compared to air, water cooling devices often demonstrate superior heat dissipation performance. This makes them particularly well-suited for scenarios that demand rigorous heat dispersion.

A conventional water cooling heat dissipation system comprises a water cooling radiator and a water cooling head connected thereto. The water cooling head is configured to absorb the heat produced by a specific heat source. Within this system, water circulates through both the water cooling radiator and the water cooling head. As water passes through the cooling head, it absorbs the generated heat, causing a rise in its temperature. Subsequently, as the heated water circulates through the water cooling radiator, it dissipates heat and brings down its temperature via one or more fans on the water cooling radiator. Furthermore, prior art heat dissipation systems, such as US20120065808A1, have disclosed the incorporation of a thermal sensor to modulate the rotational speed of multiple fans.

Nonetheless, it is observed that specific regions on said water cooling radiator, such as those near the entry point of cooling liquid, may exhibit higher temperatures. Conversely, zones near the exit point of cooling liquid may have lower temperatures. This indicates that heat dissipation is not consistent throughout the radiator. Relying on a single thermal sensor to govern the speed of all fans on the radiator uniformly can lead to suboptimal heat dispersion. Specifically, it might result in inadequate heat dissipation in hotter zones and excessive dissipation in cooler zones, thereby leading to unnecessary electrical energy consumption.

SUMMARY OF THE INVENTION

The present invention discloses a zoned heat dissipation system used for a water cooling radiator. The zoned heat dissipation system comprises a plurality of fans, a plurality of heat dissipation zones defined on the water cooling radiator, a thermal detector, and a control unit. At least one of the fans is disposed within each of the heat dissipation zones. The thermal detector is disposed within at least one of the heat dissipation zones and configured to detect the temperature of the water cooling radiator. The control unit is electrically connected to the fans and the thermal detector and configured to modulate the rotational speed of the fan within each of the heat dissipation zones based on the detected data from the thermal detector.

In some embodiments, the thermal detector comprises multiple thermal sensors, each of the heat dissipation zones has a thermal sensor disposed therein. Preferably, the control unit modulates the rotational speed of the fan within each of the heat dissipation zones, based on the temperature data detected by the thermal sensor within each of the heat dissipation zones.

In some embodiments, the thermal detector comprises multiple thermal sensors, each of the heat dissipation zones has two or more thermal sensors disposed therein. Preferably, the control unit modulates the rotational speed of the fan within each heat dissipation zone, based on the average temperature data gauged by all the thermal sensors within each heat dissipation zone.

In some embodiments, the thermal detector comprises a thermal sensor, and one of the heat dissipation zones is provided with the thermal sensor, while another heat dissipation zone lacks thermal sensors. Preferably, the control unit modulates the rotational speed of the fan within one of the heat dissipation zones, based on the temperature data gauged by the thermal sensor, and wherein the control unit further estimates a temperature estimate for another heat dissipation zone, based on the temperature data gauged by the thermal sensor, and utilizes the estimated temperature value to modulate the rotational speed of the fan in the another heat dissipation zone.

In some embodiments, the thermal detector comprises multiple thermal sensors, and one of the heat dissipation zones is provided with two or more of the thermal sensors, while another heat dissipation zone lacks thermal sensors. Preferably, the control unit modulates the rotational speed of the fan within one of the heat dissipation zones, based on the average temperature data gauged by all the thermal sensors within one of the heat dissipation zones; and wherein the control unit further estimates a temperature estimate for the another heat dissipation zone based on the average temperature, and utilizes the temperature estimate to modulate the rotational speed of the fan in the another heat dissipation zone.

The present invention further discloses a water cooling heat dissipation system used for an electronic device. The water cooling heat dissipation system comprising a heat dissipation device that is disposed on a heat source in the electronic device, a water cooling radiator that has a circulation pipe connected to the heat dissipation device, a pump that is configured to drive the cooling liquid to circulate along the circulation pipe, and the above-mentioned zoned heat dissipation system. The zoned heat dissipation system configured to facilitate zoned cooling for the water cooling radiator.

DETAILED DESCRIPTION OF EMBODIMENTS

Figure 1:
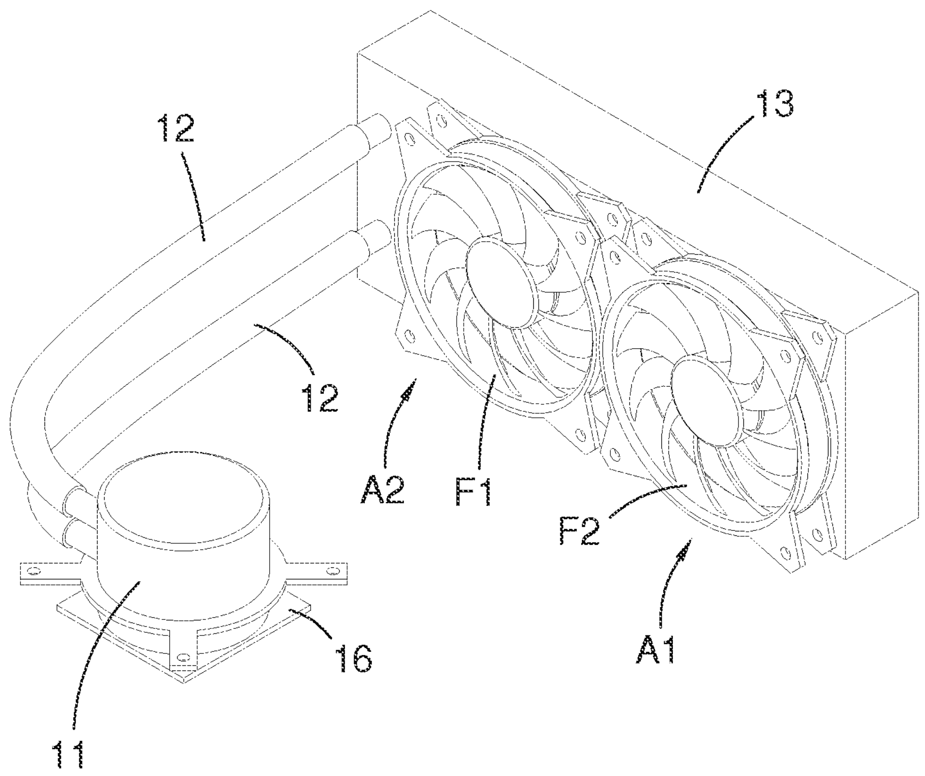
FIG. 1 is a schematic three-dimensional view of a preferred embodiment of the water cooling heat dissipation system of the present invention.
Figure 2:
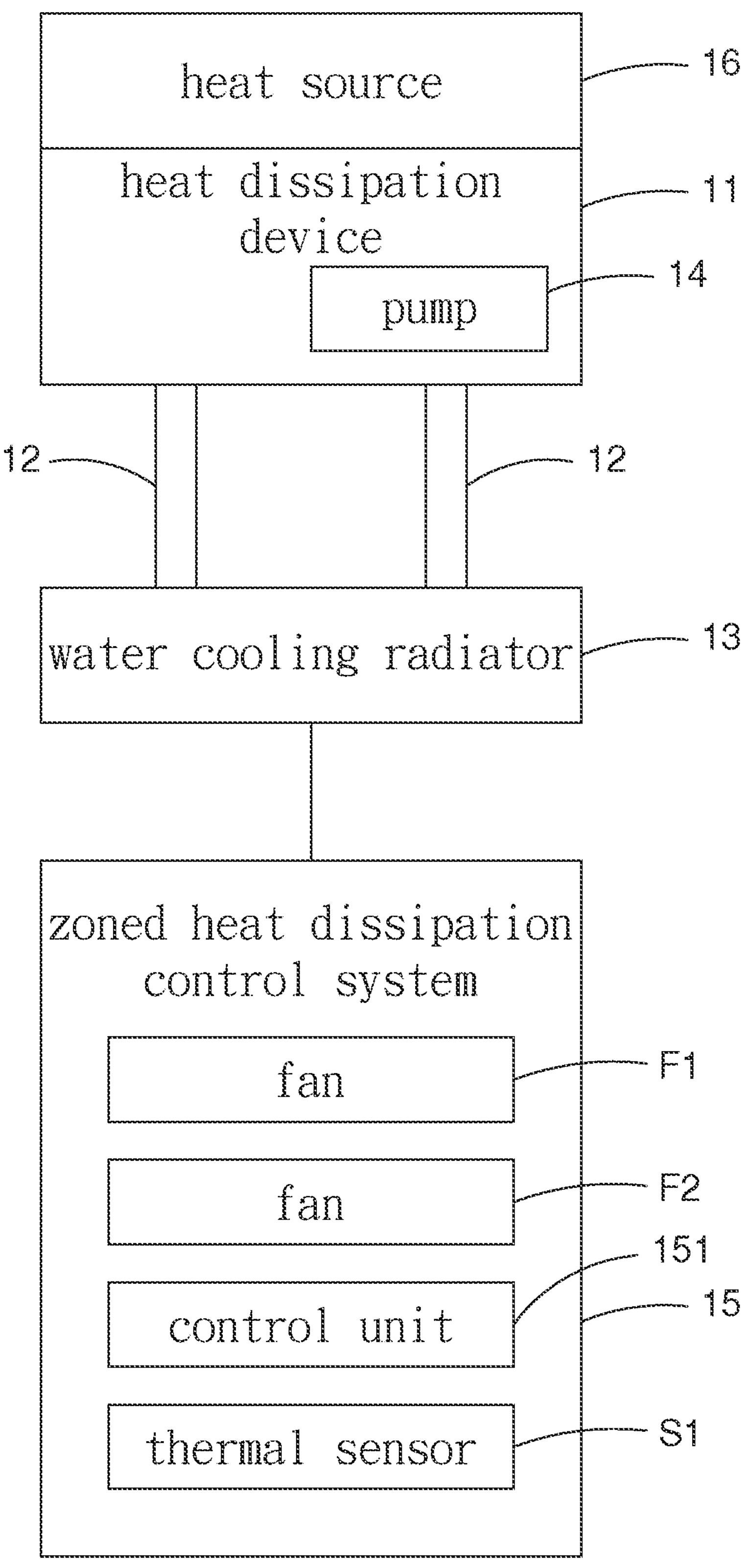
FIG. 2 is a block diagram of the preferred embodiment of the water cooling heat dissipation system of the present invention.

FIGS. 1 and 2 show a water cooling heat dissipation system of the present invention used for an electronic device. The water cooling heat dissipation system comprises a heat dissipation device 11, a circulation pipe 12, a water cooling radiator 13, a pump 14, and a zoned heat dissipation control system 15.

The heat dissipation device 11 may be a water cooling head, a heat sink or thermal grease, but is not limited thereto. The heat dissipation device 11 may be disposed on a heat source 16 to absorb the heat generated by the heat source 16. The heat source 16 may be a CPU on a computer motherboard or a GPU on a graphics card, but is not limited thereto. The heat dissipation device 11 is connected to the water cooling radiator 13 through the circulation pipe 12. The pump 14 is used to drive cooling liquid to circulate along the circulation pipe 12. The cooling liquid passes through and touches the heat dissipation device 11 during the circulation, and absorbs heat from the heat dissipation device 11. At this point, the heat dissipation device 11 is cooled while the cooling liquid is heated. The cooling liquid with increased temperature then enters the water cooling radiator 13 and is cooled by the zoned heat dissipation control system 15. The cooling liquid that has been cooled then flows back to the heat dissipation device 11 and re-absorbs heat thereof, thereby establishing a continuous cycle that mitigates the heat produced by the heat source 16.

The pump 14 in the water cooling heat dissipation system of the present invention may be disposed at any position in the entire system. In this embodiment, the pump 14 is integrated into the heat dissipation device 11.

The zoned heat dissipation control system 15 in the water cooling heat dissipation system of the present invention is defined multiple heat dissipation zones (such as heat dissipation zones A1 and A2) on the water cooling radiator 13. At least one fan (such as fans F1 and F2) is disposed in each heat dissipation zone and a thermal detector is disposed on the water cooling radiator 13. The thermal detector comprises at least one thermal sensor (such as thermal sensor S1) or more thermal sensors. A control unit (such as control unit 151) of the zoned heat dissipation control system 15 uses the thermal detector to detect the temperature of the cooling liquid in the water cooling radiator 13, and modulates the rotational speed of the fans in each heat dissipation zone according to the detected temperatures. The fans individually generate airflow at the rotational speed required by the control unit to cool the cooling liquid that flows through the water cooling radiator 13.

The configuration of the heat dissipation zones on the water cooling radiator 13 is variable. The heat dissipation zones can either be linearly aligned along the circulation pipe 12, as demonstrated by zones A1 to A3 in FIG. 3, or they can be adopted a U-shaped alignment along the circulation pipe 12, as depicted by zones A1 to A6 in FIG. 4.

The thermal sensor can be arranged based on specific requirements. It might be disposed within the circulation pipe 12 to directly gauge the cooling liquid's temperature, or placed on or in close proximity to an exterior wall of the circulation pipe 12 for an indirect temperature assessment of the cooling liquid.

Figure 3:
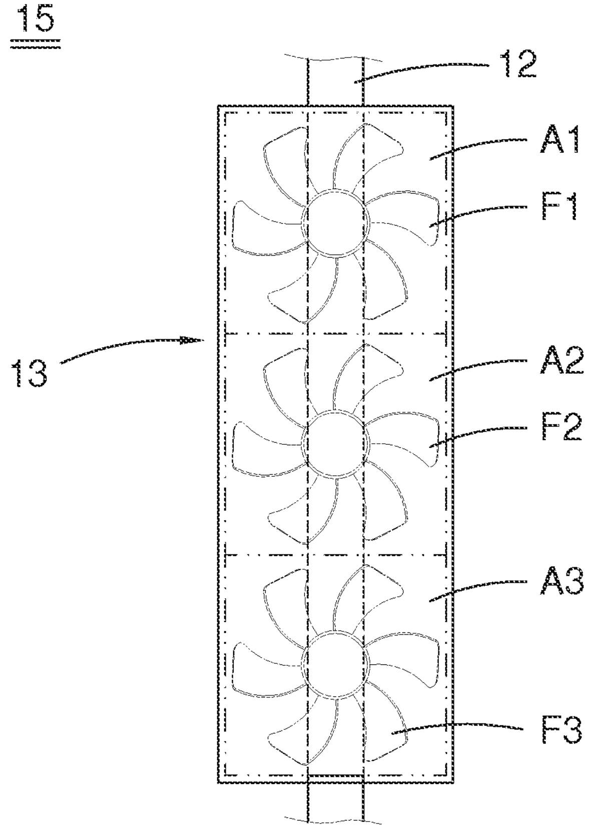
FIGS. 3 and 4 are schematic views showing two distinct configurations for the heat dissipation zones within the zoned water cooling heat dissipation system of the present invention.
Figure 4:
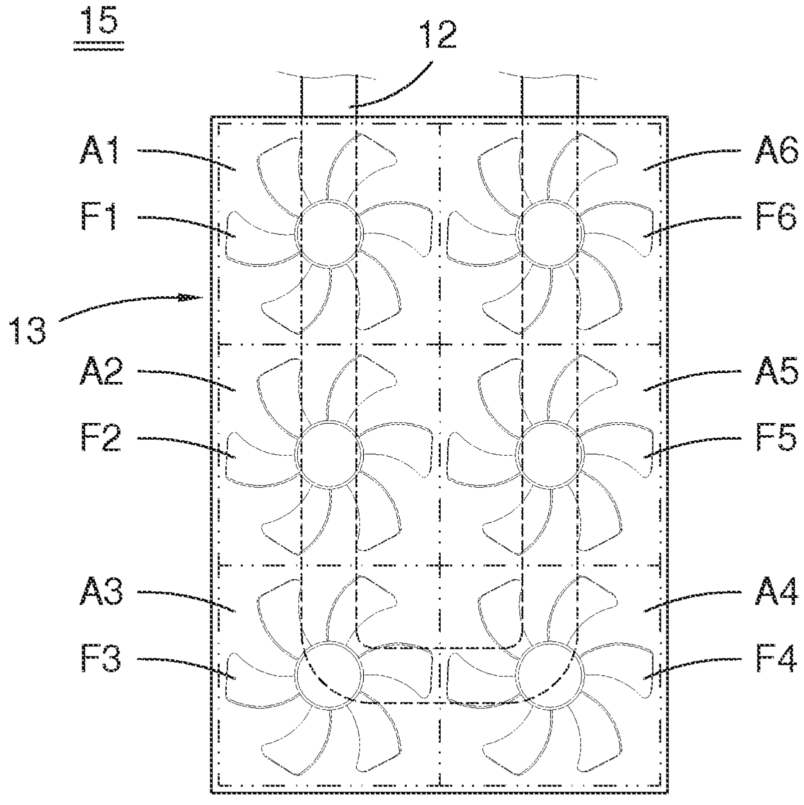

It should be noted that the positions of the heat dissipation zones on the water cooling radiator 13 and the number of fans within each heat dissipation zone may be configured according to specific needs. The illustrations in FIGS. 3 and 4 are merely exemplary.

Figures 5, 6:
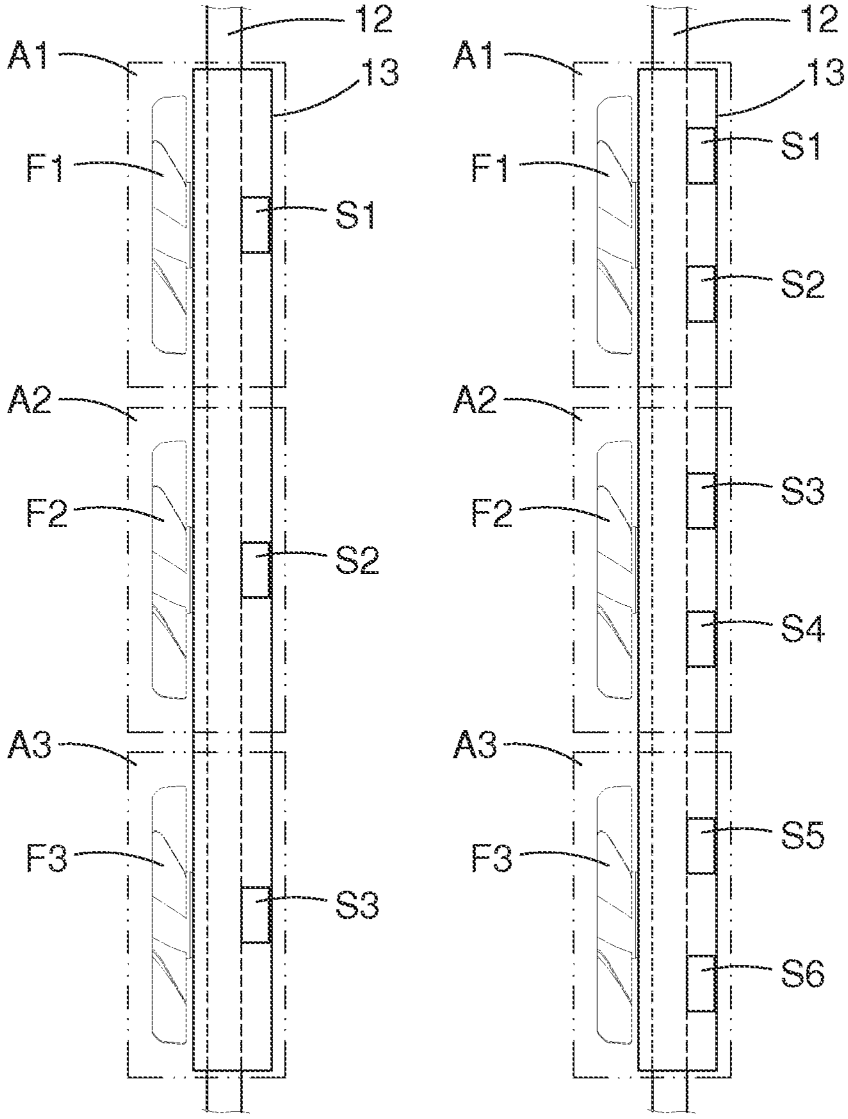
FIG. 5 is a schematic view of the first embodiment of the zoned water cooling heat dissipation system of the present invention.
FIG. 6 is a schematic view of the second embodiment of the zoned water cooling heat dissipation system of the present invention.

FIG. 5 shows the first embodiment of the zoned heat dissipation control system of the present invention. The figure provides only a partial view of the entire system. In the first embodiment, thermal sensors S1 to S3 are disposed within heat dissipation zones A1 to A3 of the water cooling radiator 13, respectively, and each of the thermal sensors S1 to S3 is configured to detect the temperature of the cooling liquid within the heat dissipation zones A1 to A3, where the sensor is located. Each of the thermal sensors S1 to S3 and the fans F1 to F3 are electrically connected to a control unit (such as the control unit 151). The control unit receives temperature data from each of the thermal sensors S1 to S3. Using a data processing technique, the control unit processes the received data to determine the control values for the fans F1 to F3 located within the heat dissipation zones A1 to A3. Based on the control values, the unit then modulates the rotational speed of the fans F1 to F3 within the heat dissipation zones A1 to A3. The data processing technique may employ a weighted calculation method considering each temperature reading in relation to environmental conditions, but is not limited thereto.

The control unit may directly modulate the rotational speeds of the fans F1 to F3 located within the heat dissipation zones A1 to A3, based on the incoming temperature data. This scenario is equivalent to one where the control unit, during its weighted calculations of temperature data, assigns a uniform weight of 1 to each reading.

Under the guidance of the control unit, the fan F1, located within the heat dissipation zone A1, adjusts its rotational speed based on the temperature reading from the thermal sensor S1. Similarly, the fan F2, located within the heat dissipation zone A2, modulates its rotational speed in response to the temperature reading from the thermal sensor S2. The fan F3, located within the heat dissipation zone A3, alters its rotational speed based on the temperature reading from the thermal sensor S3. Consequently, each fan within its respective heat dissipation zone modulates its rotational speed to match the precise cooling requirements of that zone, ensuring that regions of the water cooling radiator 13 associated with each heat dissipation zone achieve optimal cooling. This approach addresses the inefficiencies of prior art systems, where excessive energy consumption occurred due to suboptimal cooling, that is, over-cooling in cooler zones and under-cooling in hotter zones.

FIG. 6 shows the second embodiment of the zoned heat dissipation control system of the present invention. The figure provides only a partial view of the entire system. In the second embodiment, two or more thermal sensors are disposed within each of the heat dissipation zones on the water cooling radiator 13. Specifically, thermal sensors S1 and S2 are disposed within the heat dissipation zone A1 to gauge the temperature of the cooling liquid therein. Likewise, thermal sensors S3 and S4 are disposed within the heat dissipation zone A2 to gauge the temperature of the cooling liquid therein. Additionally, sensors S5 and S6 are disposed within the heat dissipation zone A3 to gauge the temperature of the cooling liquid therein. Each of the sensors S1 to S3, along with the fans F1 to F3, are electrically connected to a control unit (such as the control unit 151). The control unit receives temperature data from each of the thermal sensors S1 to S6. Using a data processing technique, the control unit processes the received data to determine the control values for the fans F1 to F3 located within the heat dissipation zones A1 to A3. Based on the control values, the unit then modulates the rotational speed of the fans F1 to F3 within the heat dissipation zones A1 to A3. The data processing technique may employ a weighted calculation method considering each temperature reading in relation to environmental conditions, but is not limited thereto.

The control unit may regulate the rotational speed of the fans within each heat dissipation zone, based directly on the average temperature data collected by all the thermal sensors within each heat dissipation zone. In this case, the rotational speed of the fan F1 located within the heat dissipation zone A1 is adjusted based on the average temperature readings from the thermal sensors S1 and S2. Similarly, the rotational speed of the fan F2 located within the heat dissipation zone A2 is adjusted based on the average temperature readings from the thermal sensors S3 and S4. The rotational speed of the fan F3 located within the heat dissipation zone A3 is adjusted its rotational speed based on the average temperature readings from the thermal sensors S5 and S6. Consequently, the rotational speed of each fan within its respective heat dissipation zone is modulated to match the precise cooling requirements of that zone, ensuring that regions of the water cooling radiator 13 associated with each heat dissipation zone achieve optimal cooling. This approach addresses the inefficiencies of prior art systems, where excessive energy consumption occurred due to suboptimal cooling, that is, over-cooling in cooler zones and under-cooling in hotter zones.

One notable benefit of the second embodiment is that the control unit may gather temperature data from multiple locations within a single heat dissipation zone. This ensures that each of the control values derived, such as said average values, offer a more accurate representation of the actual cooling requirements of each heat dissipation zone. In other words, this enables the control unit to optimally modulate the rotational speed of each fan to meet the cooling demands required by each control value.

Figures 7, 8:
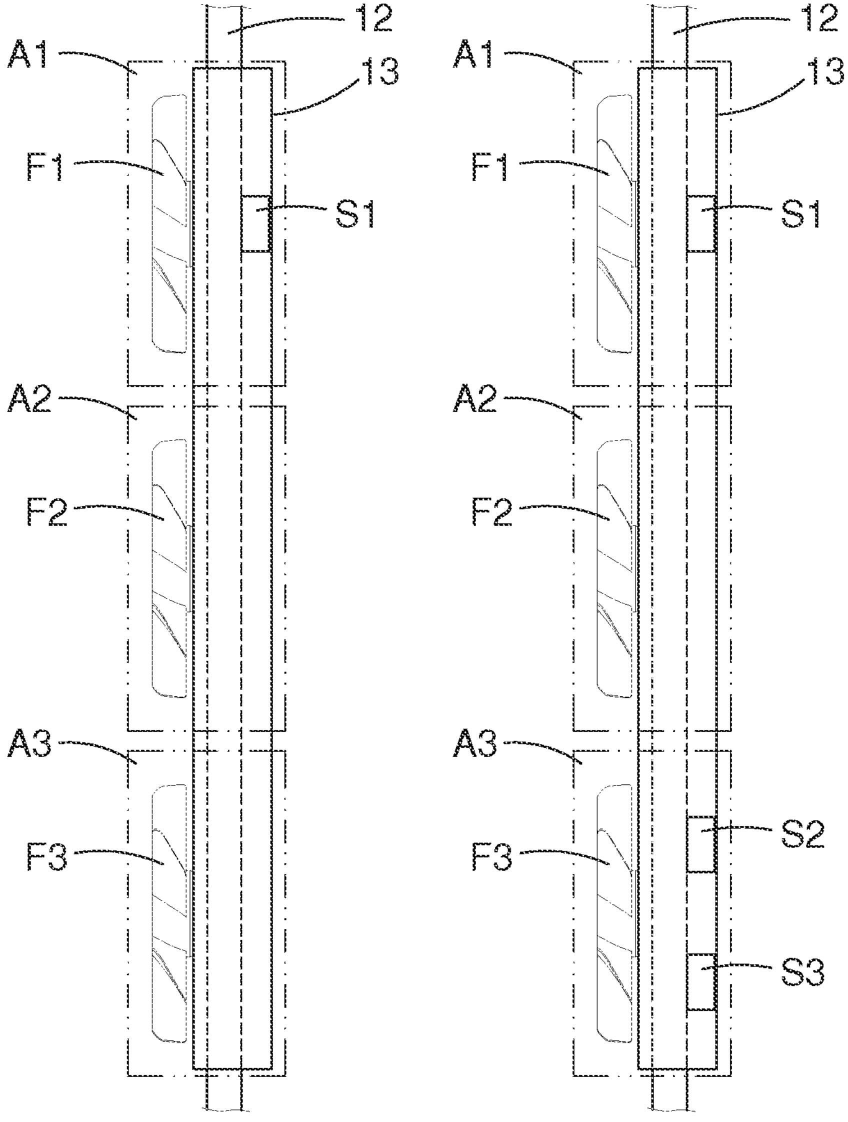
FIG. 7 is a schematic view of the third embodiment of the zoned water cooling heat dissipation system of the present invention.
FIG. 8 is a schematic view of the fourth embodiment of the zoned water cooling heat dissipation system of the present invention.

FIG. 7 shows the third embodiment of the zoned heat dissipation control system of the present invention. The figure provides only a partial view of the entire system. In the third embodiment, some heat dissipation zones on the water cooling radiator 13 are furnished with thermal sensors, while others are devoid of sensors. Specifically, of the heat dissipation zones A1 to A3, only the zone A1 is provided with a thermal sensor S1. In contrast, the heat dissipation zones A2 and A3 are provided with no thermal sensor. The thermal sensor S1 is used to gauge the temperature of the cooling liquid within the heat dissipation zone A1. The thermal sensor S1 and the fans F1 to F3 are electrically connected to a control unit (such as the control unit 151). The control unit is configured to receive temperature data from the thermal sensor S1.

While the temperature data collected by the control unit merely reflects the state of the heat dissipation zone A1, where the thermal sensor S1 is located, the unit may employ a data processing technique to refine this information in accordance with ambient conditions. By applying weighted calculations to the temperature data gauged by the sensor S1, the control unit estimates temperature estimates for the other heat dissipation zones, A2 and A3, that lack thermal sensors. Subsequently, the control unit utilizes both the gauged temperature data and the estimated temperature values as control values to modulate the rotational speeds of the fans F1 to F3 within the heat dissipation zones A1 to A3. As a result, the rotational speed of the fan F1 in the heat dissipation zone A1 is adapted according to the temperature reading from the sensor S1. Simultaneously, the rotational speed of the fans F2 and F3 in the zones A2 and A3 are adjusted based on the estimated temperatures from the control unit. For example, regions farther from the entry point of the cooling liquid into the water cooling radiator 13, which are likely to exhibit lower temperatures, may experience a decrease in fan speed, whereas hotter zones may witness an increase. Consequently, each fan within its respective heat dissipation zone modulates its rotational speed to match the precise cooling requirements of that zone, ensuring that regions of the water cooling radiator 13 associated with each heat dissipation zone achieve optimal cooling. This approach addresses the inefficiencies of prior art systems, where excessive energy consumption occurred due to suboptimal cooling, that is, over-cooling in cooler zones and under-cooling in hotter zones.

One notable benefit of the third embodiment lies in its potential for reducing the number of thermal sensors, subsequently trimming the overall construction costs of the system. Typically, the heat dissipation zone closer to the exit point of the cooling water from the water cooling radiator 13, where temperatures tend to be cooler, demands less heat dissipation and holds lesser significance, thus potentially eliminating the need for a thermal sensor. Furthermore, given the similarity in environmental conditions across neighboring heat dissipation zones, the temperature from one zone can serve as a proxy for its adjacent counterpart. For example, the temperature detected in the heat dissipation zone A1 may serve as an estimation for the zone A2, while the temperature in the zone A2 may serve as an estimation for the zone A3, and so on. Consequently, it may be sufficient to install a thermal sensor in just one among adjacent heat dissipation zones.

FIG. 8 shows the fourth embodiment of the zoned heat dissipation control system of the present invention. The figure provides only a partial view of the entire system. In the fourth embodiment, on the water cooling radiator 13, some heat dissipation zones are equipped with a single thermal sensor, others have none, and still others have two or more sensors. For instance, the zone A1 has a single thermal sensor S1; the zone A2 is without a sensor; and the zone A3 has two sensors S2 and S3. The thermal sensors S1 to S3 and the fans F1 to F3 are electrically connected to a control unit (such as the control unit 151). This control unit is configured to receive the temperature data registered by the sensors S1 to S3.

While the temperature data collected by the control unit merely reflects the state of the heat dissipation zones A1 and A3, where the thermal sensors S1 and S3 are located, the unit may employ a data processing technique to refine this information in accordance with ambient conditions. By applying weighted calculations to the temperature data collected for the zones A1 and A3, the control unit estimates temperature estimates for the heat dissipation zone A2 that lacks thermal sensors. Subsequently, the control unit utilizes both the gauged temperature data and the estimated temperature values as control values to modulate the rotational speeds of the fans F1 to F3 within the heat dissipation zones A1 to A3. As a result, for the zone A1, the control unit directly leverages temperature readings from the sensor S1 to regulate the rotational speed of the fan F1, which is akin to giving a weight of 1 to the data in the weighted calculation. For the zone A3, the control unit averages readings from the sensors S2 and S3 to adjust the rotational speed of the fan F3. In contrast, for the zone A2 that lacks sensors, the control unit either uses temperature estimates derived from a weighted calculation based on the sensor S1's reading or an average taken from the sensors S2 and S3 to regulate the rotational speed of the fan F2, ensuring optimal heat dissipation in the zone A2. Consequently, each fan within its respective heat dissipation zone modulates its rotational speed to match the precise cooling requirements of that zone, ensuring that regions of the water cooling radiator 13 associated with each heat dissipation zone achieve optimal cooling. This approach addresses the inefficiencies of prior art systems, where excessive energy consumption occurred due to suboptimal cooling, that is, over-cooling in cooler zones and under-cooling in hotter zones.

One notable benefit of the fourth embodiment is that it allows for a selective reduction in the number of thermal sensors in specific heat dissipation zones while simultaneously increasing the number of sensors in critical zones.

What is claimed is:

1. A zoned heat dissipation system used for a water cooling radiator, comprising:

a plurality of fans;

a plurality of heat dissipation zones defined on the water cooling radiator, at least one of the fans being disposed within each of the heat dissipation zones;

a thermal detector configured to detect the temperature of the water cooling radiator, wherein the thermal detector comprises a thermal sensor, and one of the heat dissipation zones is provided with the thermal sensor, while another heat dissipation zone lacks thermal sensors; and a control unit electrically connected to the fans and the thermal detector, wherein the control unit modulates the rotational speed of the fan within one of the heat dissipation zones, based on temperature data gauged by the thermal sensor, and wherein the control unit further estimates a temperature for another heat dissipation zone, based on the temperature data gauged by the thermal sensor, and utilizes the estimated temperature to modulate the rotational speed of the fan in another heat dissipation zone.

2. A zoned heat dissipation system used for a water cooling radiator, comprising:

a plurality of fans;

a plurality of heat dissipation zones defined on the water cooling radiator, at least one of the fans being disposed within each of the heat dissipation zones;

a thermal detector configured to detect the temperature of the water cooling radiator, wherein the thermal detector comprises multiple thermal sensors, and one of the heat dissipation zones is provided with two or more of the thermal sensors, while another heat dissipation zone lacks thermal sensors;

a control unit electrically connected to the fans and the thermal detector, wherein the control unit modulates the rotational speed of the fan within one of the heat dissipation zones, based on average temperature data gauged by all the thermal sensors within one of the heat dissipation zones; and wherein the control unit further estimates a temperature for another heat dissipation zone based on the average temperature data, and utilizes the estimated temperature to modulate the rotational speed of the fan in another heat dissipation zone.

3. A water cooling heat dissipation system used for an electronic device, comprising:

a heat dissipation device disposed on a heat source in the electronic device;

a water cooling radiator having a circulation pipe connected to the heat dissipation device, the circulation pipe containing cooling liquid;

a pump configured to drive the cooling liquid to circulate along the circulation pipe; and a zoned heat dissipation system configured to facilitate zoned cooling for the water cooling radiator, wherein the zoned heat dissipation system comprises:

a plurality of fans;

a plurality of heat dissipation zones defined on the water cooling radiator, at least one of the fans being disposed within each of the heat dissipation zones;

a thermal detector configured to detect the temperature of the water cooling radiator, wherein the thermal detector comprises a thermal sensor, and one of the heat dissipation zones is provided with the thermal sensor, while another heat dissipation zone lacks thermal sensors; and a control unit electrically connected to the fans and the thermal detector, wherein the control unit modulates the rotational speed of the fan within one of the heat dissipation zones, based on temperature data gauged by the thermal sensor, and wherein the control unit further estimates a temperature for another heat dissipation zone, based on the temperature data gauged by the thermal sensor, and utilizes the estimated temperature to modulate the rotational speed of the fan in another heat dissipation zone.

4. A water cooling heat dissipation system used for an electronic device, comprising:

a heat dissipation device disposed on a heat source in the electronic device;

a water cooling radiator having a circulation pipe connected to the heat dissipation device, the circulation pipe containing cooling liquid;

a pump configured to drive the cooling liquid to circulate along the circulation pipe; and a zoned heat dissipation system configured to facilitate zoned cooling for the water cooling radiator, wherein the zoned heat dissipation system comprises:

a plurality of fans;

a plurality of heat dissipation zones defined on the water cooling radiator, at least one of the fans being disposed within each of the heat dissipation zones;

a thermal detector configured to detect the temperature of the water cooling radiator, wherein the thermal detector comprises multiple thermal sensors, and one of the heat dissipation zones is provided with two or more of the thermal sensors, while another heat dissipation zone lacks thermal sensors; and a control unit electrically connected to the fans and the thermal detector, wherein the control unit modulates the rotational speed of the fan within one of the heat dissipation zones, based on average temperature data gauged by all the thermal sensors within one of the heat dissipation zones; and wherein the control unit further estimates a temperature for another heat dissipation zone based on the average temperature, and utilizes the estimated temperature to modulate the rotational speed of the fan in another heat dissipation zone.

* * * * *